(12) United States Patent
Buer et al.

(10) Patent No.: US 8,300,493 B2
(45) Date of Patent: Oct. 30, 2012

(54) ENCODED READ-ONLY MEMORY (ROM) DECODER

(75) Inventors: Myron Buer, Savage, MN (US); Brandon Bartz, Bloomington, MN (US); Dechang Sun, Eden Prairie, MN (US)

(73) Assignee: Broadcom Corporation, Irvine, CA (US)

( * ) Notice: Subject to any disclaimer, the term of this patent is extended or adjusted under 35 U.S.C. 154(b) by 161 days.

(21) Appl. No.: 12/970,405

(22) Filed: Dec. 16, 2010

(65) Prior Publication Data

US 2011/0242927 A1    Oct. 6, 2011

Related U.S. Application Data

(60) Provisional application No. 61/320,126, filed on Apr. 1, 2010.

(51) Int. Cl.
*G11C 8/00*    (2006.01)

(52) U.S. Cl. .................................. 365/230.06; 365/154
(58) Field of Classification Search ............ 365/230.06, 365/154
See application file for complete search history.

(56) References Cited

U.S. PATENT DOCUMENTS

7,154,300 B2 * 12/2006 Anders et al. ................... 326/86
* cited by examiner

*Primary Examiner* — Son Dinh
*Assistant Examiner* — Nam Nguyen
(74) *Attorney, Agent, or Firm* — Sterne, Kessler, Goldstein & Fox P.L.L.C.

(57) ABSTRACT

Decoder circuits capable of decoding encoded ROM memory are provided. Embodiments provide several improvements over prior solutions which rely primarily on CMOS logic (e.g., inverters). For example, embodiments provide faster decoding by limiting the number of decoding stages to a single stage. Further, embodiments allow the use of partial swing (as opposed to full swing) on the bit lines, which results in significant power reduction. This, in turn, results in reduced amounts of capacitor discharges when reading the data.

18 Claims, 14 Drawing Sheets

ENCODED READ-ONLY MEMORY (ROM) DECODER

CROSS-REFERENCE TO RELATED APPLICATION(s)

The present application claims the benefit of U.S. Provisional Patent Application No. 61/320,126 filed on Apr. 1, 2010, which is incorporated herein by reference in its entirety.

BACKGROUND

1. Field of the Invention

The present invention relates generally to memory decoders.

2. Background Art

Today, various products and applications (e.g., Bluetooth products, WLAN products, mobile baseband and multimedia processors, etc.) require significant amounts of on-chip read-only memory (ROM).

Conventional ROM bitcells, bitcell arrays, and memory architectures suffer from a number of problems, including area inefficiency, high cost, and high power consumption due to high leakage, for example.

There is a need therefore for improved ROM bitcells, bitcell arrays, and memory architectures.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Encoded Read Only Memory (ROM) Embodiments

Figure 1:
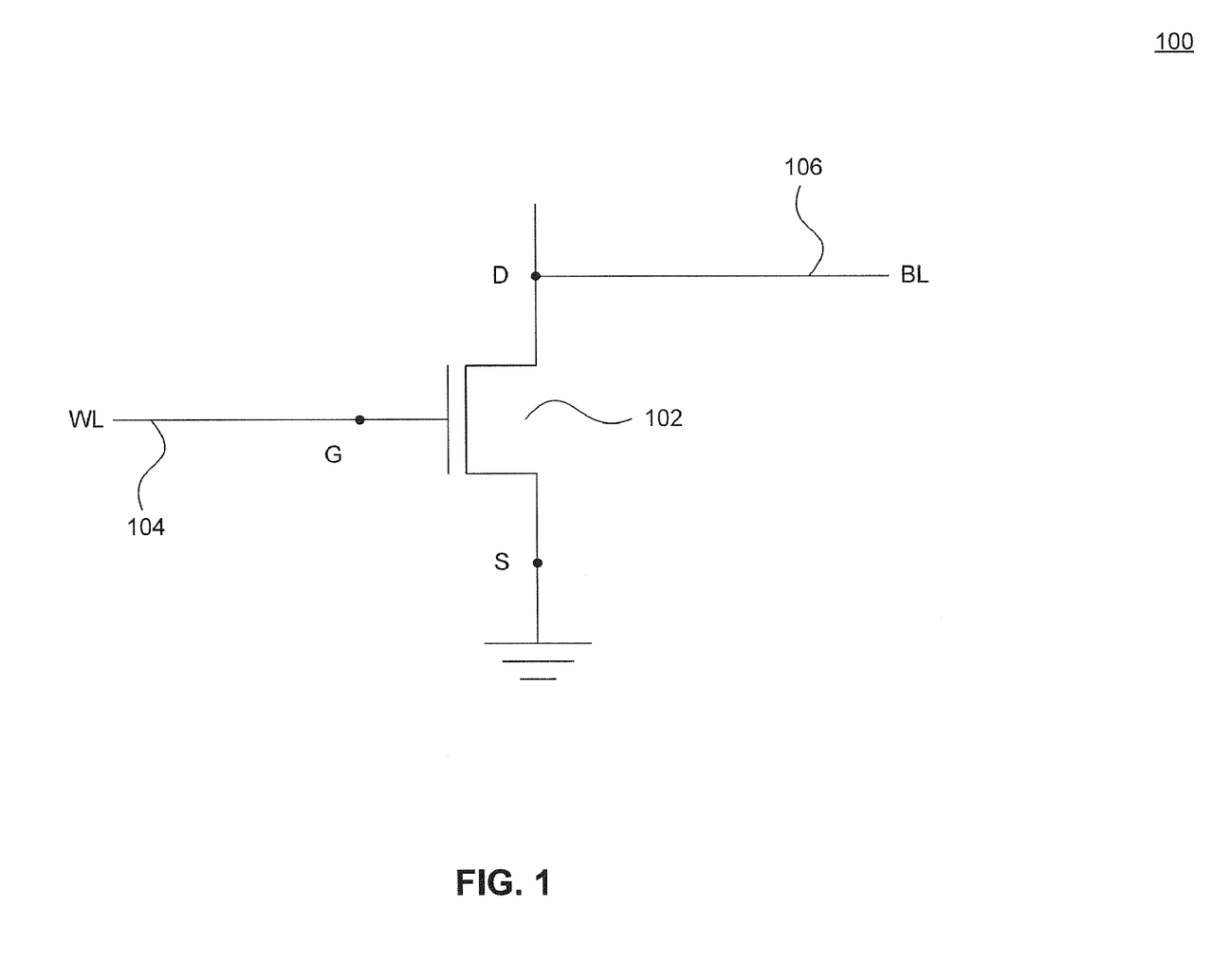
FIG. 1 illustrates a conventional memory bitcell.

FIG. 1 illustrates a conventional ROM bitcell 100. As shown in FIG. 1, bitcell 100 includes a MOS (Metal Oxide Semiconductor) transistor 102. Typically, the source terminal of MOS transistor 102 is coupled to ground, and the drain terminal of MOS transistor 102 is pre-charged to one of two pre-determined voltage values (depending on whether a 1 or a 0 is being stored in bitcell 100). The gate terminal of MOS transistor 102 is coupled to a word line (WL) 104, and the drain terminal of MOS transistor 102 is connected to a bit line (BL) 106.

In standby mode (i.e., when bitcell 100 is not being read), a low voltage (e.g., ground) is applied on WL 104. As a result, the voltage on BL 106 reflects the pre-charged voltage value applied to the drain terminal. When bitcell 100 is being read, the voltage on WL 104 is raised (or in other words, WL 104 is activated). Depending on the pre-charged voltage value applied to the drain terminal, MOS transistor 102 will either turn ON or remain OFF. Consequently, the voltage on BL 106 would either pull down to ground or remain at the pre-value charged voltage value, thereby reflecting the logic value stored therein. For example, the voltage on BL 106 would fall to a low value when a 0 is stored in bitcell 100, and remain high when a 1 is stored in bitcell 100. Generally, a sensing structure (e.g., inverter circuit) is used to sense the voltage on BL 106, and output the logic value corresponding to the voltage.

Various techniques exist for programming bitcell 100. For example, bitcell 100 may be programmed at manufacture time by masking. Accordingly, the combination/pattern of conductive/insulation layers and vias act to connect the drain terminal of bitcell 100 to a first voltage supply if a logic 1 is to be stored in bitcell 100, and to a second voltage supply if a logic 0 is to be stored in bitcell 100. When data programming is done by masking, the data programmed in bitcell 100 may not be changed during operation. Alternative techniques can be used if re-programming of the data is desired.

As described above, conventional bitcell 100 allows for a single logic state or bit to be stored therein. As a result, when large amounts of ROM are needed, conventional bitcell array solutions tend to be large in area and thus high in cost. Embodiments of the present invention, as further described below, provide improved ROM bitcell structures, bitcell arrays, and ROM architectures having increased data storage capabilities, smaller area, lower cost, and significantly reduced power consumption/loss.

Figure 2:
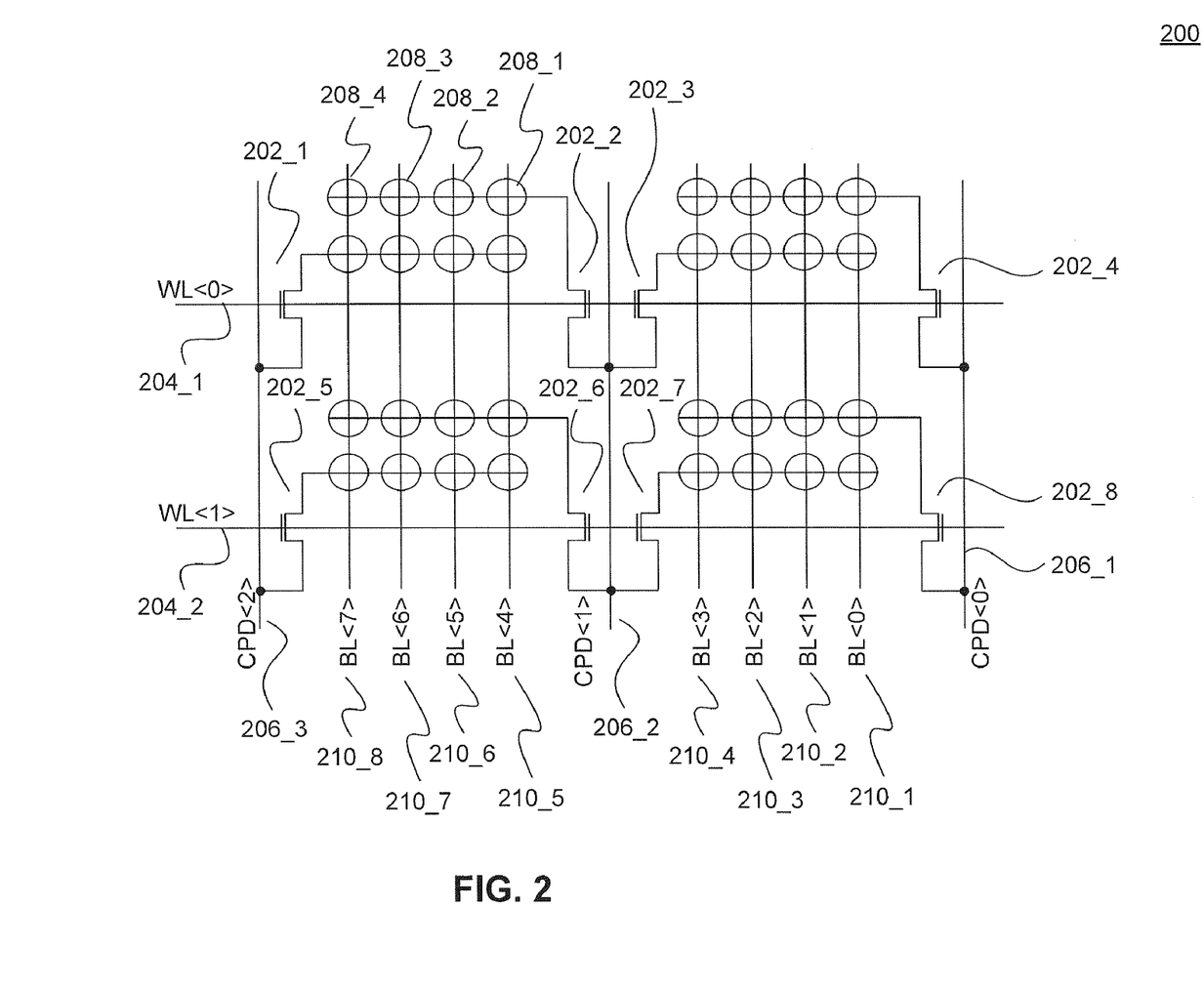
FIG. 2 illustrates an example memory array according to an embodiment of the present invention.

FIG. 2 illustrates an example memory array 200 according to an embodiment of the present invention. Memory array 200 represents an encoded ROM array according to an embodiment of the present invention. For simplification purposes, only two rows and four columns of example memory array 200 are shown in FIG. 2. However, as would be understood by a person of skill in the art based on the teachings herein, example memory array 200 may include any number of rows/columns, depending on the use requirements of the array.

As shown in FIG. 2, example memory array 200 includes a plurality of memory cells, with each memory cell including a MOS transistor 202 and four associated program nodes 208. For example, MOS transistor 202-2 and program nodes 208_1, 208_2, 208_3, and 208_4 comprise one memory cell of memory array 200. Thus, example memory array 200 includes eight memory cells as shown in FIG. 2.

Each memory cell of example memory array 200 can be programmed to store two bits of data (00, 01, 10, and 11), by connecting only one of its associated program nodes to the drain terminal of its MOS transistor. The logic state (i.e., 00, 01, 10, or 11) stored in the memory cell is determined by which of its associated program nodes is coupled to the drain terminal of its MOS transistor. For example, to store a "00" in the memory cell of MOS transistor 202_2, the drain terminal of MOS transistor 202_2 may be coupled to program node

208_4. To store a "01" in the same memory cell, the drain terminal of MOS transistor 202_2 may be coupled to program node 208_3, and so on.

As shown in FIG. 2, each memory cell of example memory array 200 is coupled through its associated program nodes 208 to four bit lines 210. Bit lines 210 are used to read out the data stored in the memory cell. For example, the memory cell of MOS transistor 202_2 is coupled through its associated program nodes 208_1, 208_2, 208_3, and 208_4 to four bit lines 210_5, 210_6, 210_7, and 210_8. To reduce area, bit lines 210 are shared vertically and horizontally among multiple memory cells. For example, bit lines 210_1 through 210_4 are shared vertically by the memory cells of MOS transistors 202_3 and 202_7, and 202_4 and 202_8; and are shared horizontally by the memory cells of MOS transistors 202_3 and 202_4, and 202_7 and 202_8.

In addition, each memory cell is associated with one word line and one CPD (common pull down) line which are activated (i.e., pulled high or low) to access the data stored in the memory cell. The word line is coupled to the gate terminal of the MOS transistor of the memory cell, and the CPD line is coupled to the source terminal of the MOS transistor of the memory cell.

Further, to minimize area, word lines and CPD lines can be shared among memory cells according to embodiments of the present invention. For example, in memory array 200, the memory cells of MOS transistors 202_1, 202_2, 202_3, and 202_4 share the same WL 204_1, and are said to have the same row memory address. Similarly, memory cells having adjacent column memory address may share the same CPD line. For example, in memory array 200, the memory cells of MOS transistors 202_2, 202_3, 202_6, and 202_7 share the same CPD line 206_2.

Generally, example memory array 200 is data programmed such that only memory cells of same row address (i.e., same WL) and that share a CPD line need to be accessed simultaneously. This allows for the vertical/horizontal sharing of bit lines, as described above, to be possible. For example, referring to FIG. 2, the memory cells of MOS transistors 202_2 and 202_3 will be read out together. With each memory cell providing two bits of data, 4 bits of data can be decoded from bit lines 210_1 through 210_8.

To access a given memory cell, its associated WL and CPD line are activated simultaneously. For example, to access the memory cell of MOS transistor 202_2, both WL 204_1 and CPD line 206_2 are activated. In an embodiment, this includes switching WL 204_1 from low (e.g., ground) to high (e.g., Vdd) and pulling down CPD line 206_2 from high (e.g., Vdd) to low (e.g., ground). Program nodes 208 (of every memory cell) are pre-charged at manufacture time to a high value voltage. Thus, when WL 204_1 and CPD 206_2 are activated, MOS transistor 202_2 turns ON, causing the program node actually connected to the drain terminal of MOS transistor 202_2 to fall down from its pre-charged high value voltage to a low voltage. Because only one of program nodes 208_1, 208_2, 208_3, and 208_4 is connected to the drain terminal of MOS transistor 202_2, when MOS transistor 202_2 turns ON, a single one of program nodes 208_1, 208_2, 208_3, and 208_4 will fall and the others will continue to reflect the high voltage value. The falling program node determines the logic state stored in the memory cell.

In an embodiment, a sensing circuit (e.g., a differential sense amplifier), not shown in FIG. 2, is coupled to bit lines 210_1 through 210_8 in order to decode the voltage value transitions on bit lines 210_1 through 210_8 into data. The sensing circuit outputs 2 bits based on bit lines 210_1 through 210_4 and 2 bits based on bit lines 210_5 through 210_8. The sensing circuit only needs partial bit line swing to correctly sense the data. The smaller bit line swing translates into less power consumption and higher speed.

As would be understood by a person skilled in the art based on the teachings herein, memory cell/array embodiments are not limited to 2-bit memory cells as described above in FIG. 2, but extend to n-bit memory cells where n is any integer number. Further, embodiments are not limited to the example memory cell structure in FIG. 2 (i.e., with four program nodes per memory cell), but extend to memory cell structures having more or less than four program nodes per memory cell and more or less than four bit lines coupled to each memory cell. Additional example memory arrays according to embodiments are provided below for further illustration.

Figure 3A:
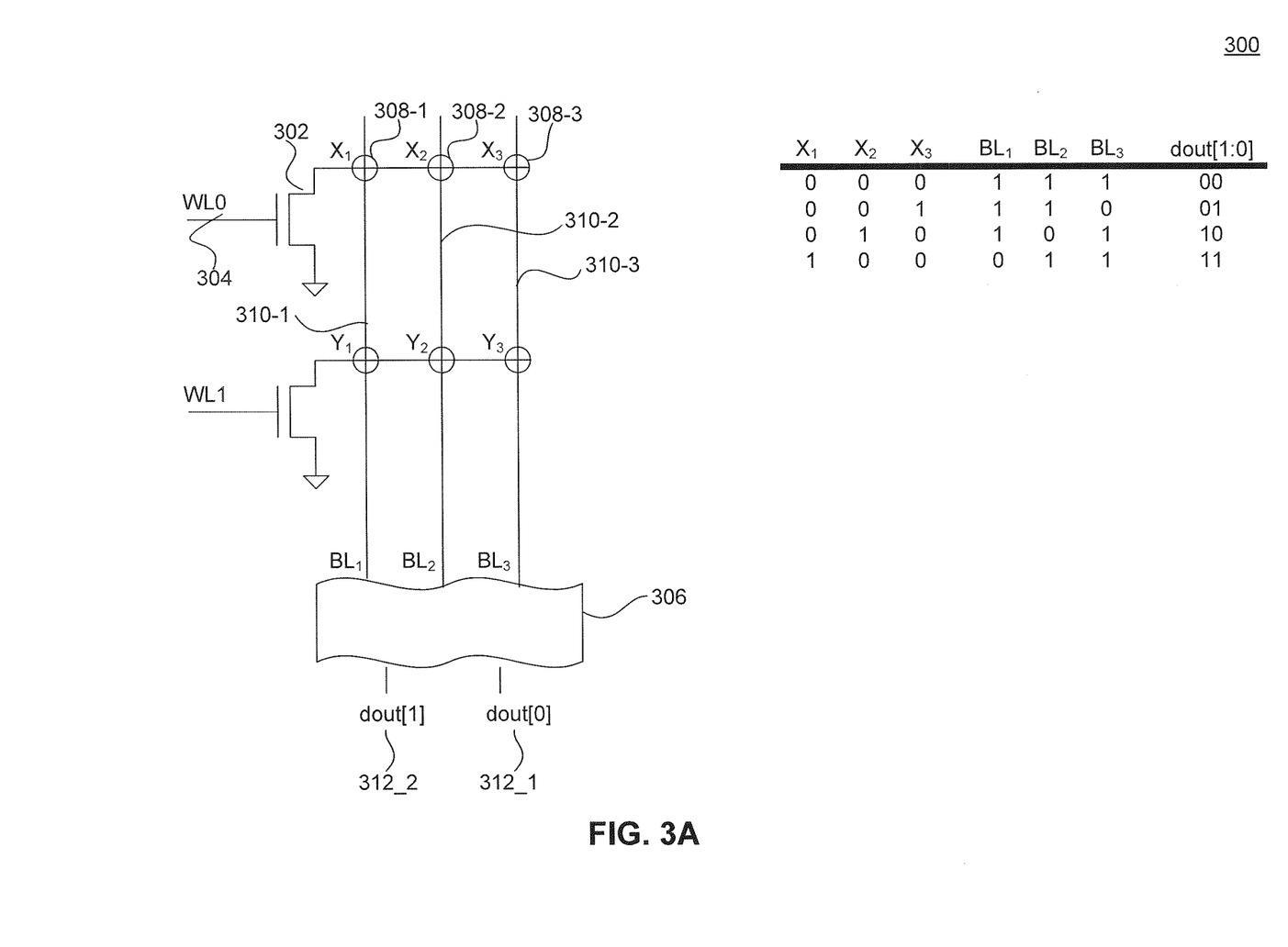
FIG. 3A-B illustrate an example memory array according to an embodiment of the present invention.
Figure 3B:
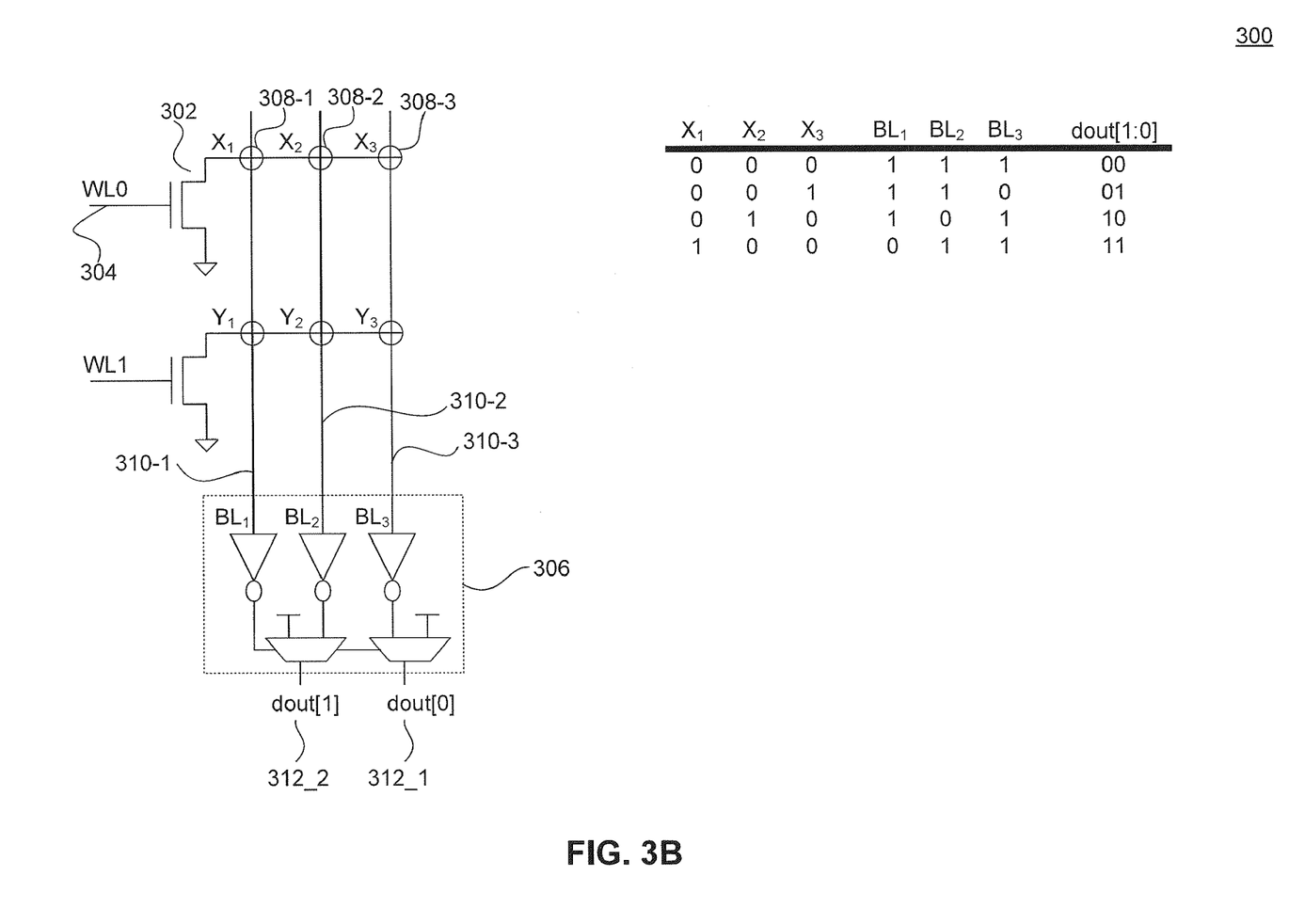

FIGS. 3A-B illustrate an example memory array 300 according to an embodiment of the present invention. For simplification purposes, a single column of the memory array is shown in FIGS. 3A-B. Therefore, CPD lines are omitted, and the source terminals of the MOS transistors 302 are shown being coupled to ground. However, a person of skill in the art would appreciate based on the teachings herein that example memory array 300 can implemented using a CPD functionality as described above in FIG. 2, for example.

As shown in FIG. 3A, each memory cell in example array 300 includes a MOS transistor 302 and three associated program nodes 308_1, 308_2, and 308_3. The gate terminal of MOS transistor 302 is coupled to a word line (WL) 304, which is raised high when the memory cell is being accessed. Program nodes 308_1, 308_2, and 308_3 are coupled to respective bit lines 310_1, 310_2, and 310_3, which are used to read the data stored in the memory cell. In an embodiment, bit lines 310_1, 310_2, and 310_3 are input into a decoder circuit 306, which generates data signals 312_1 and 312_2 that represent the data stored in the memory cell. An example embodiment of decoder circuit 306 is shown in FIG. 3B.

Each memory cell in example array 300 can be programmed to store up to two bits. In an embodiment, programming is performed by connecting at most one of the associated program nodes 308 of the memory cell to the drain terminal of the MOS transistor of the memory cell. Thus, the logic state (i.e., 00, 01, 10, or 11) stored in the memory cell is determined by which, if any, of its associated program nodes is coupled to the drain terminal of its MOS transistor. For example, as illustrated by the truth table shown in FIG. 3A, a "00" logic state is programmed in the memory cell by not connecting any of program nodes 308_1, 308_2, and 308_3 to the drain terminal of MOS transistor 302. Thus, when WL 304 is raised, each of bit lines 310_1, 310_2, and 310_3 will remain high (i.e., floating), to reflect the "00" encoded state. Similarly, to encode a "01" logic state, only program node 308_3 is connected to the drain terminal of MOS transistor 302, and program nodes 308_1 and 308_2 are kept floating.

It is noted that example memory array 300 requires three program nodes per memory cell (compared to four in example array 200) and three bit lines per memory column (bit lines can also be shared between adjacent columns). Thus, chip area is saved.

Figure 4:
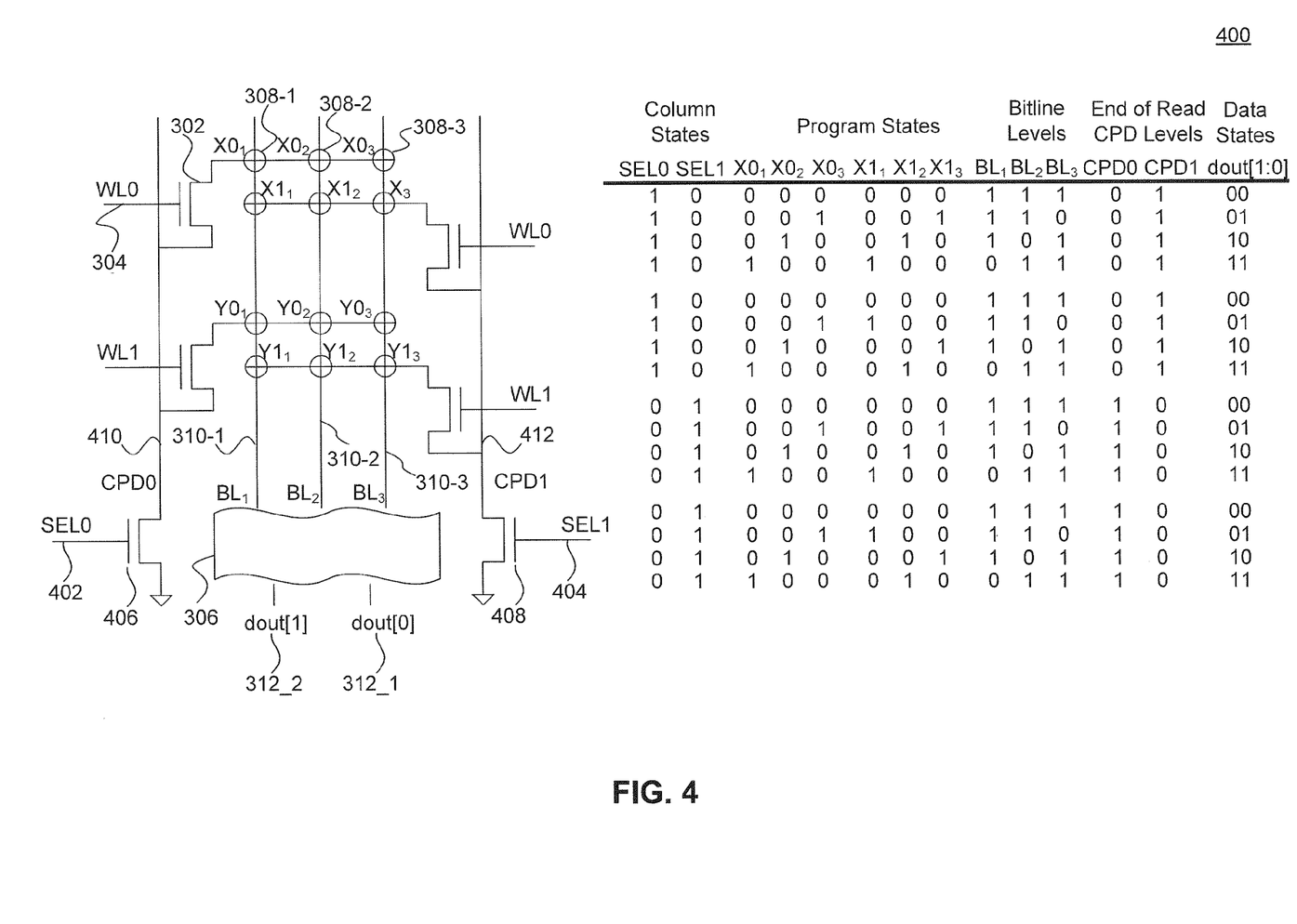
FIG. 4 illustrates an example memory array according to an embodiment of the present invention.

FIG. 4 illustrates another example memory array 400 according to an embodiment of the present invention. Example memory array 400 uses a similar 2-bit memory cell structure as described above in FIGS. 3A-3B. In addition, example memory array 400 uses a CPD functionality as described above with reference to FIG. 2. In particular, example array 400 includes first and second CPD lines 410 and 412 for selecting the memory column being accessed (the word lines 304 select the memory row being accessed). In an embodiment, CPD lines 410 and 412 are controlled respectively by select signals 402 and 404. For example, as shown in FIG. 4, select signals 402 and 404 drive respectively the gate terminals of transistors 406 and 404, with CPD line 410 being connected to the drain terminal of transistor 406 and CPD line 412 being connected to the drain terminal of transistor 408.

To enable sharing of bit lines 308 among memory columns, select signals 402 and 404 are controlled so that one or the other is high at any given time. This in turn ensures that one or the other of CPD lines 410 and 412 is active at any given time, and that no two adjacent column memory cells (sharing the same bit lines 308) are accessed simultaneously.

Figure 5:
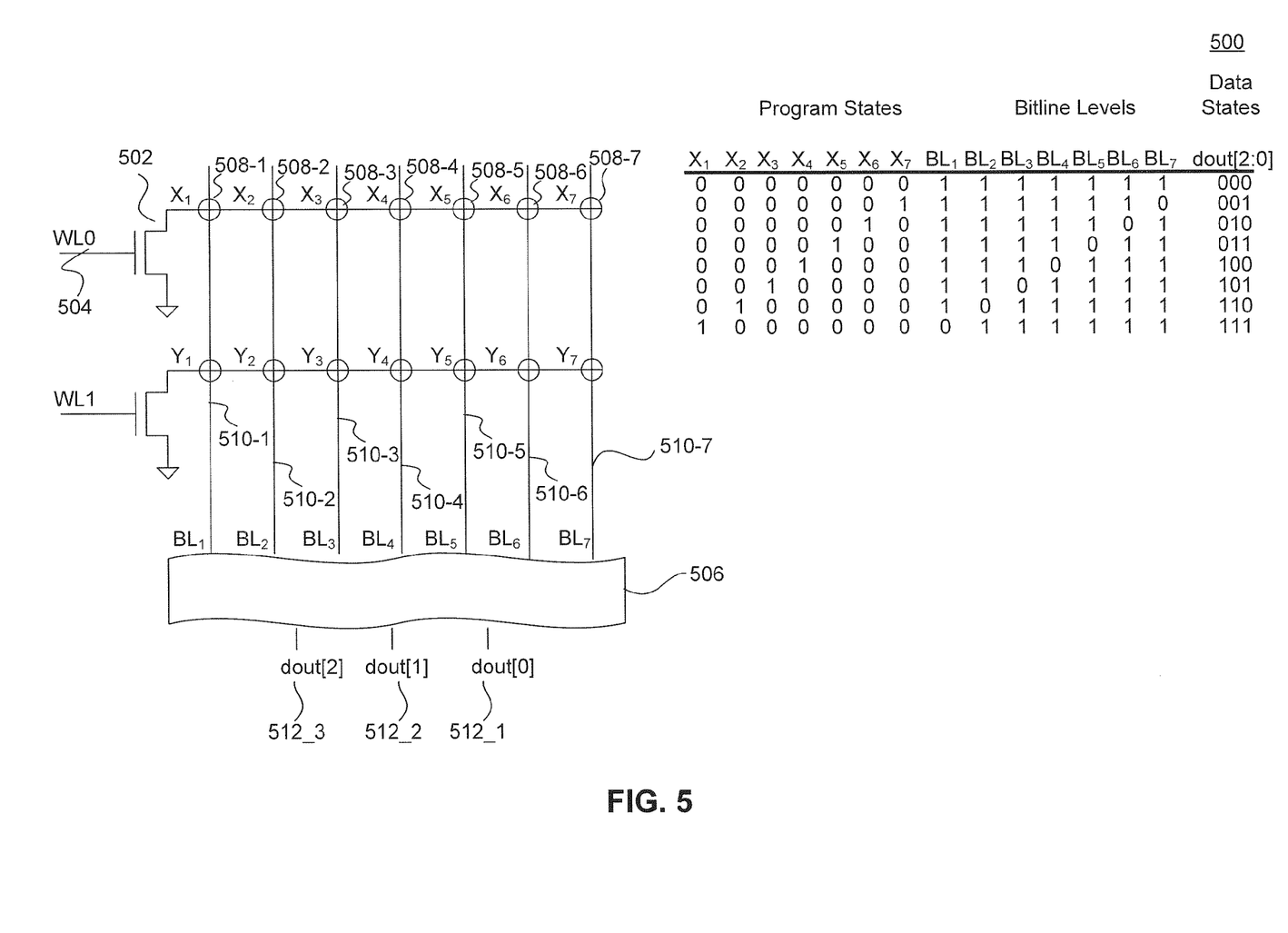
FIG. 5 illustrates an example memory array according to an embodiment of the present invention.

FIG. 5 illustrates another example memory array 500 according to an embodiment of the present invention. For simplification purposes, a single column of the memory array is shown in FIG. 5. Therefore, CPD lines are omitted, and the source terminals of the MOS transistors 502 are shown being coupled to ground. However, a person of skill in the art would appreciate based on the teachings herein that example memory array 500 can implemented using a CPD functionality as described above in FIGS. 2 and 4, for example.

Example memory array 500 is similar to example memory array 300 described above with reference to FIGS. 3A-3B, with a difference being that example array 500 uses 3-bit memory cells (compared to 2-bit memory cells in example array 300). Thus, each memory cell in example array 500 includes a MOS transistor 502 and seven associated program nodes 508_1 through 508_7. The gate terminal of MOS transistor 502 is coupled to a word line (WL) 504, which is raised high when the memory cell is being accessed. Program nodes 508_1 through 508_7 are coupled to respective bit lines 510_1 through 510_7, which are used to read the data stored in the memory cell. In an embodiment, bit lines 510_1 through 510_7 are input into a decoder circuit 506, which generates data signals 512_1, 512_2, and 512_3 that represent the 3-bit data stored in the memory cell.

As in example array 300, programming of a memory cell is performed by connecting at most one of the associated program nodes 508 of the memory cell to the drain terminal of the MOS transistor of the memory cell. Thus, the logic state (i.e., 000, 001, 010, etc.) stored in the memory cell is determined by which, if any, of its associated program nodes is coupled to the drain terminal of its MOS transistor. For example, as illustrated by the truth table shown in FIG. 5, a "000" logic state is programmed in the memory cell by not connecting any of program nodes 508 to the drain terminal of MOS transistor 502. Thus, when WL 504 is raised, each of bit lines 510_1 through 510_7 will remain high (i.e., floating), to reflect the "000" encoded state. Similarly, to encode a "001" logic state, only program node 508_7 is connected to the drain terminal of MOS transistor 302, and program nodes 508_1 through 508_6 are kept floating.

Encoded ROM Decoder Embodiments

Embodiments of the present invention also include decoder circuits capable of decoding (reading) encoded ROM embodiments provided above. In the following, exemplary decoder embodiments will be presented. These exemplary embodiments are provided for the purpose of illustration only and are not limiting of decoder embodiments of the present invention. Furthermore, while the exemplary decoder embodiments will be provided below using particular transistor/logic implementations (e.g., NMOS, PMOS, etc.), embodiments are not limited to the exemplary implementations provided herein, but may be readily extended, as would be understood by a person of skill in the art, to other implementations (e.g., CMOS).

Figure 6A:
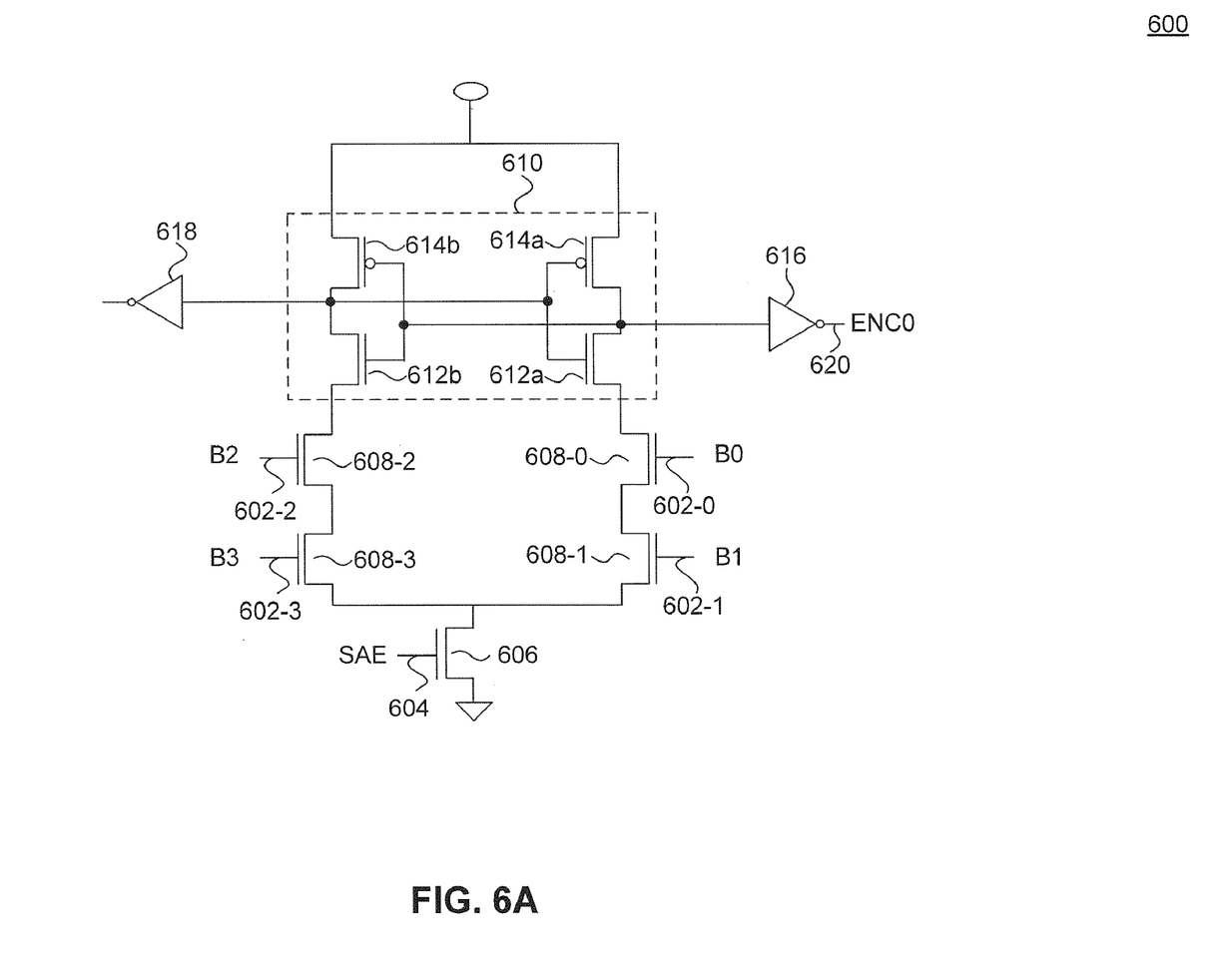
FIGS. 6A-B illustrate example decoder circuitry according to an embodiment of the present invention.
Figure 6B:
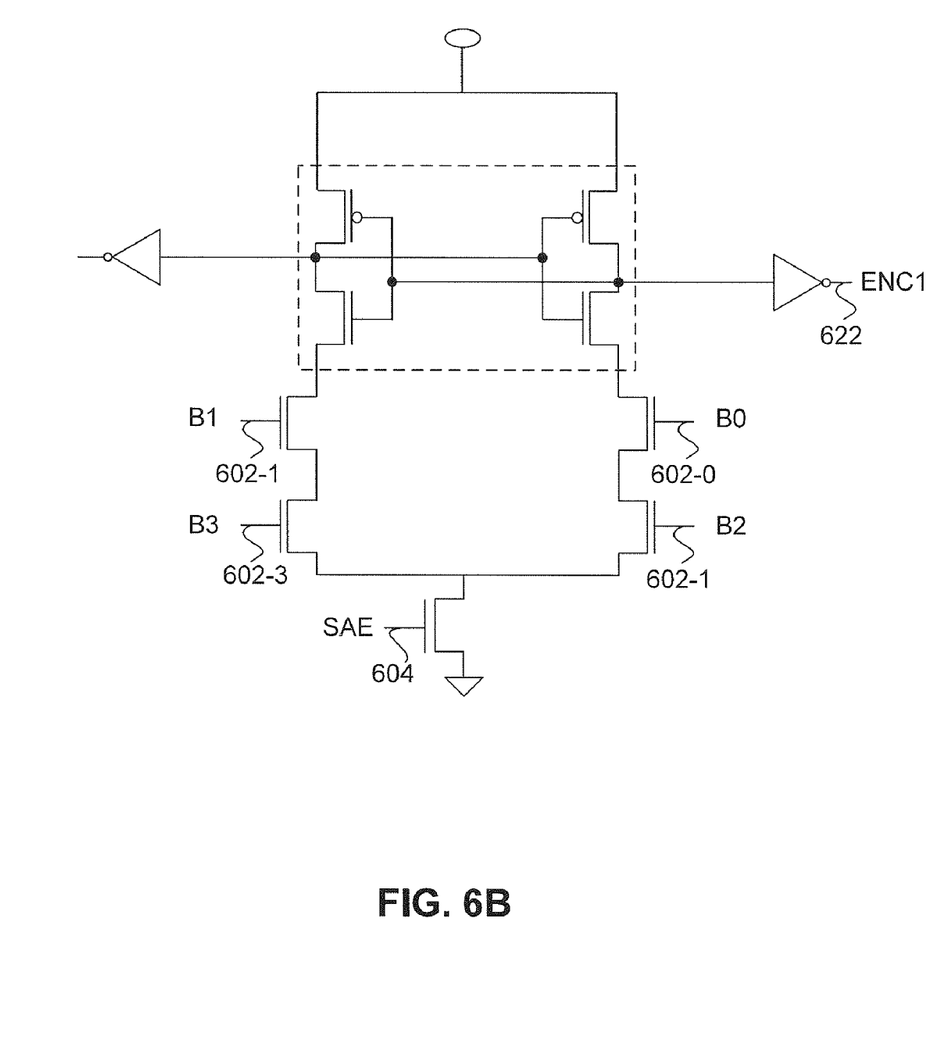

FIGS. 6A-B illustrate example decoder circuitry according to an embodiment of the present invention. In particular, FIGS. 6A-B illustrate example decoder circuitry for implementing a 2-bit encoded ROM decoder according to an embodiment of the present invention. The example decoder circuitry of FIGS. 6A-B implement a 2-bit encoded ROM decoder for reading a 2-bit encoded ROM memory cell, programmable according to the decoding logic table of FIG. 6C. As shown in FIGS. 6A-B, the example decoder circuitry include two substantially similar decoding circuits, with the decoding circuit shown in FIG. 6A configured to resolve the value of the first bit of the two bits encoded in the 2-bit encoded ROM memory cell (shown as ENC0 620 in FIG. 6A), and the decoding circuit shown in FIG. 6B configured to resolve the value of the second bit of the two bits encoded in the 2-bit encoded ROM memory cell (shown as ENC1 622 in FIG. 6B). The two decoding circuits as can be seen from FIGS. 6A and 6B only differ with respect to the manner in which the bit lines (B0-B3) from the encoded ROM memory are connected to the input terminals of the decoding circuit. Thus, for the purpose of simplification, only decoding circuit 600 of FIG. 6A will be described herein, with the description/operation of the decoding circuit of FIG. 6B becoming readily apparent to a person of skill in the art in view of the teachings herein.

Referring to FIG. 6A, decoding circuit 600 is a latching sense amplifier (LSA). Decoding circuit 600 includes input circuitry, comprising a plurality of input transistors 608-{0, . . . , 3}, and output circuitry, comprising a cross-coupled NMOS-PMOS structure 610 and inverters 616 and 618.

As shown in FIG. 6A, input transistors 608 are configured so as to create a balanced input stage of decoding circuit 600. In particular, series-coupled input transistors 608-0 and 608-1 provide a first branch of the input stage, and series-coupled input transistors 608-2 and 608-3 provide a second branch of the input stage. A common pull-down transistor 606 is coupled to the source end of each branch of the input stage. Pull-down transistor 606 is controlled via a control signal SAE 604, coupled to the gate terminal of transistor 606. Thus, control signal SAE 604 serves to enable/disable decoding circuit 600 to resolve bit lines B0-B4.

Cross-coupled NMOS-PMOS structure 610 includes two symmetrical branches, each comprising an NMOS transistor 612 and a PMOS transistor 614. Each NMOS-PMOS branch 612-614 is series-coupled to a respective branch of the input circuitry of decoding circuit 600. For example, the branch comprising NMOS transistor 612a and PMOS transistor 614a is series-coupled to the input circuitry branch comprising NMOS transistors 608-0 and 608-1. In addition, the two symmetrical branches of structure 610 are cross-coupled to one another so that a common gate terminal of each branch is coupled to a common drain terminal of the other branch. In turn, the common gate terminal of branch 612a-614a is coupled to inverter 616 to produce signal ENC0 620. The common gate terminal of branch 612b-614b is symmetrically provided to a dummy inverter 618.

Input transistors 608-{0, . . . 3} respectively receive input signals 602-{0, . . . , 3}. Input transistors 608 may be NMOS transistors as shown in FIG. 6B. Alternatively, PMOS or other transistor types may be used as would be understood by a person skilled in the art based on the teachings herein. Input signals 602-{0, . . . 3} correspond respectively to bit lines B0-B3 from a 2-bit encoded ROM memory. For example, input signals 602-{0, . . . , 3} may correspond respectively to bit lines 210_5, 210_6, 210_7, and 210_8, used to read out the data stored in the memory cell of MOS transistor 202_2 in FIG. 2. Input signals 602-{0, ..., 3} can take values according to the four possible logic combinations of bit lines B0-B3 shown in FIG. 6C.

Operation of decoding circuit 600 to generate signal ENC0 620 based on input signals 602-{0, ..., 3} will now be described. For the purpose of simplification, operation is described only for the bit line logic combination shown in the first row of the encoding logic table of FIG. 6C (i.e., B3=1, B2=1; B1=1; and B0=0). It is thus assumed that input signals 602-{0, ..., 3} are all initially at a logic high level, and that input signal 602-0 (which corresponds to bit line B0) is transitioning from a logic high (e.g., 1) to a logic low (e.g., 0). It is also assumed that SAE signal 604 is enabled at the same time as the transitioning of input signal 602-0.

When input signal 602-0 begins to transition from high to low, the current drive capability of input transistor 608-0 begins to decrease. As a result, less current begins to flow through the first branch of the input stage (i.e., series-coupled input transistors 608-0 and 608-1) than in the second branch of the input stage (i.e., series-coupled transistors 608-2 and 608-3). Consequently, the voltage at the common drain terminal of branch 612a-614a of structure 610, which is coupled to the common gate terminal of branch 612b-614b, begins to increase. This, in turn, causes more current to flow through branch 612b-614b, and further voltage drop at the common drain terminal of branch 612b-614b (which is coupled to the common gate terminal of branch 612a-614a). Accordingly, even less current flows through branch 612a-614a, causing the input to inverter 616 to be at a logic high value and thus ENC0 620 to take a logic low value.

Figure 6C:
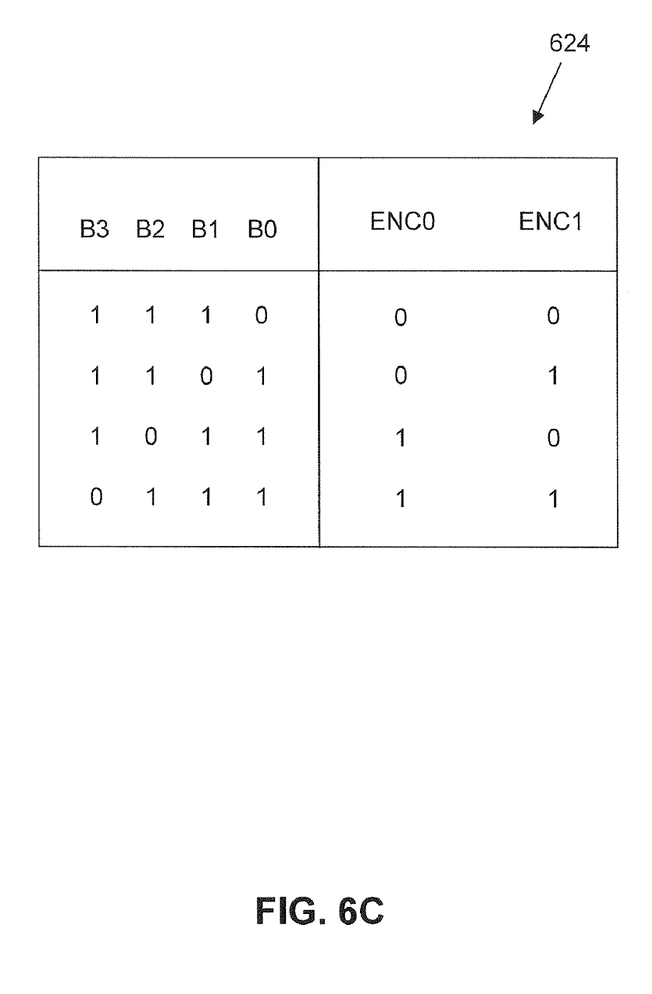
FIG. 6C shows an example decoding logic table implemented by the example decoder circuitry of FIGS. 6A-B.

As would be understood by a person of skill in the art based on the teachings herein, operation of decoding circuit 600 for the logic combination shown in the third row of the table of FIG. 6C is substantially similar to the operation described above. Operation for the logic combinations shown in the second and fourth rows of the table of FIG. 6C is also similar, with the bit line transitioning (i.e., B1 or B3 transitioning from 1 to 0) effects on current/voltage levels within the circuit being the reverse of the description above due to the symmetry of the circuit.

Figure 7:
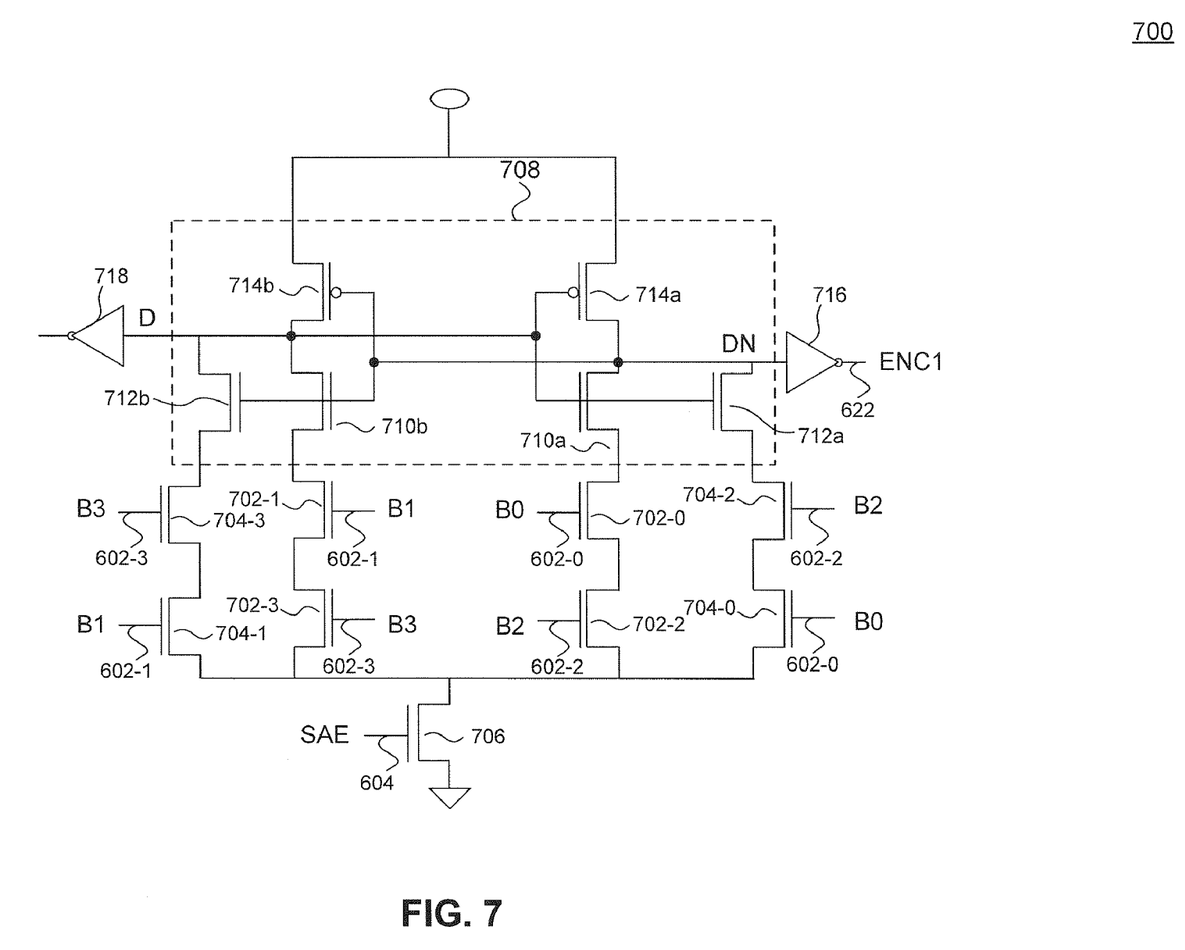
FIG. 7 illustrates another example decoder circuitry according to an embodiment of the present invention.

FIG. 7 illustrates another example decoder circuit 700 according to an embodiment of the present invention. Decoder circuit 700 is configured to resolve the second bit of a 2-bit encoded ROM memory cell. As described above with reference to FIGS. 6A-6B, a second substantially similar decoder circuit (differing only with respect to the mariner in which the bit line inputs are connected to the input transistors of the decoder) can be used to resolve the first bit of the 2-bit encoded ROM memory cell.

Like decoder circuit 600, decoder circuit 700 includes input circuit, comprising a plurality of input transistors 702 and 704, and output circuitry, comprising a cross-coupled NMOS-PMOS structure 708 and inverters 716 and 718.

Input transistors 702 and 704 are configured to create a balanced input stage of decoding circuit 700. In particular, input transistors 702-0, 702-2, 704-0, and 704-2 provide a two-leg first branch of the input stage, with series-coupled transistors 702-0 and 702-2 providing a first leg of the first branch and series-coupled transistors 704-0 and 704-2 providing a second leg of the first branch. Similarly, input transistors 702-1, 702-3, 704-1, and 704-3 provide a two-leg second branch of the input stage, with series-coupled transistors 702-1 and 702-3 providing a first leg of the second branch and series-coupled transistors 704-1 and 704-3 providing a second leg of the second branch.

The multiple leg per input branch configuration of decoder 700 has several benefits. In particular, the configuration reduces the effects of device variations (e.g., due to operating voltage, temperature, and process variations), resulting in better decoder reliability and improved performance.

As in decoder 600, a common pull-down transistor 606 is coupled to the source end of each branch of the input stage. Pull-down transistor 606 is controlled via a control signal SAE 604, coupled to the gate terminal of transistor 606.

Cross-coupled NMOS-PMOS structure 708 includes two symmetrical branches, each comprising two NMOS transistors 710 and 712 and a PMOS transistor 714. Each NMOS-PMOS branch is coupled to a respective branch of the input circuitry. In addition, the two symmetrical branches of structure 708 are cross-coupled to one another so that a common gate terminal of each branch is coupled to a common drain terminal of the other branch. The common gate terminal of branch 710b, 712b, 714b is coupled to inverter 716 to produce signal ENC1 622. The common gate terminal of branch 710a, 712a, 714a is symmetrically provided to a dummy inverter 718.

Input transistors 702 and 704 receive input signals 602-{0, ..., 3} as shown in FIG. 7. Input transistors 702 and 704 may be NMOS transistors as shown in FIG. 7. Alternatively, PMOS or other transistor types may be used as would be understood by a person skilled in the art based on the teachings herein. Input signals 602-{0, ..., 3} correspond respectively to bit lines B0-B3 from a 2-bit encoded ROM memory.

Operation of decoding circuit 700 to generate signal ENC1 622 based on input signals 602-{0, ..., 3} is substantially similar to the operation of decoder circuit 600 described above and thus will be omitted herein.

Figure 8A:
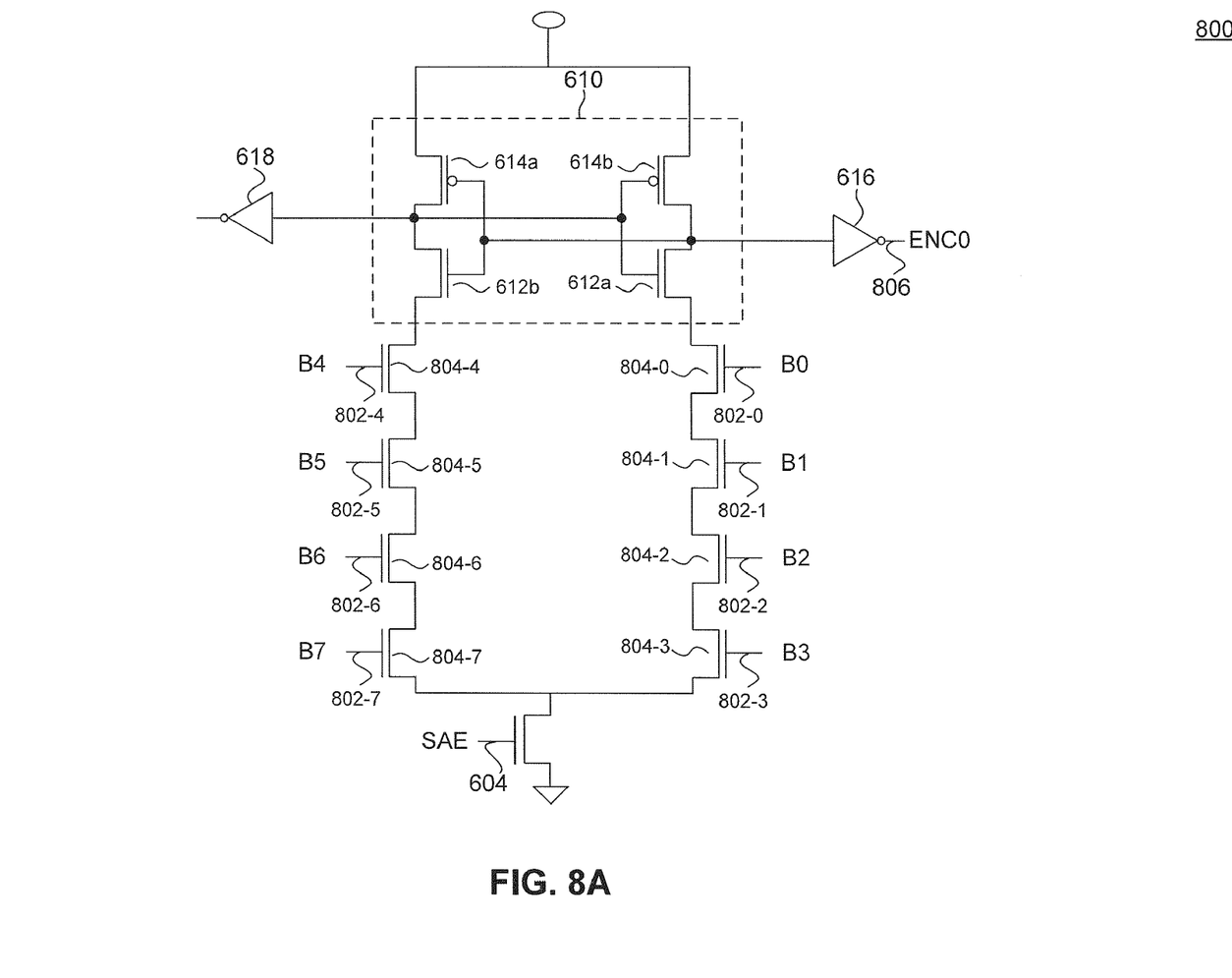
FIGS. 8A-C illustrate another example decoder circuitry according to an embodiment of the present invention.
Figure 8B:
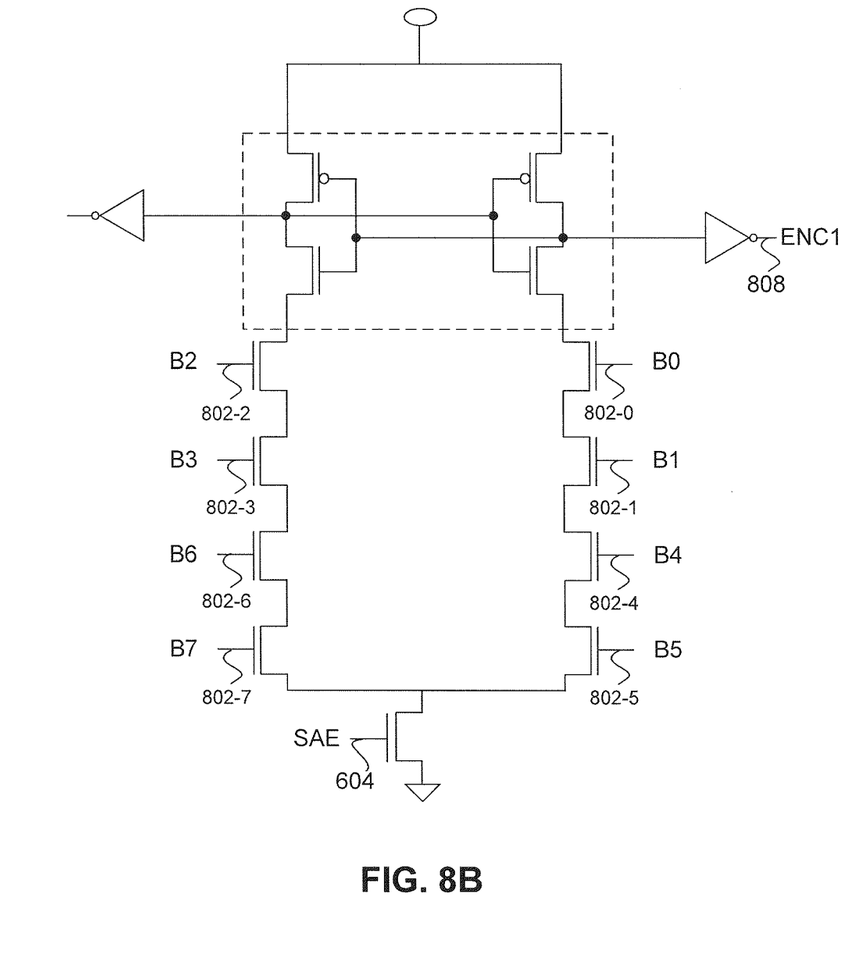
Figure 8C:
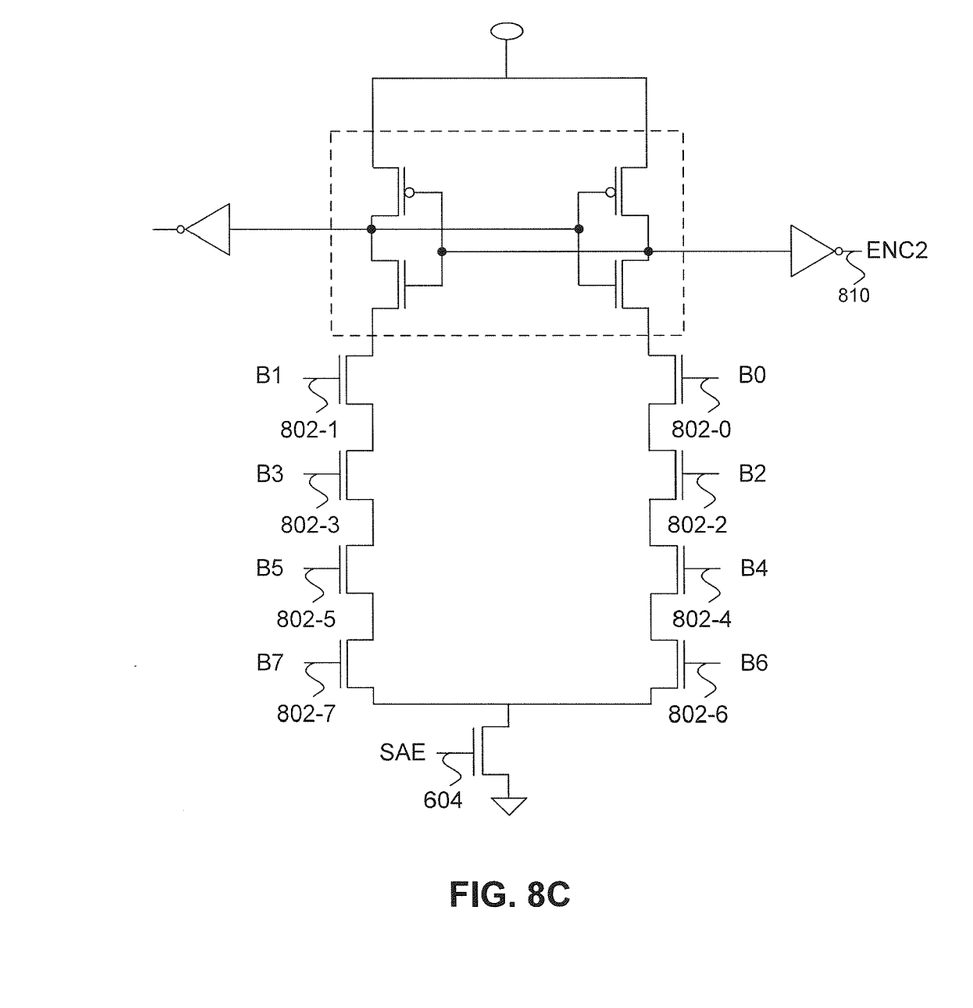
Figure 8D:
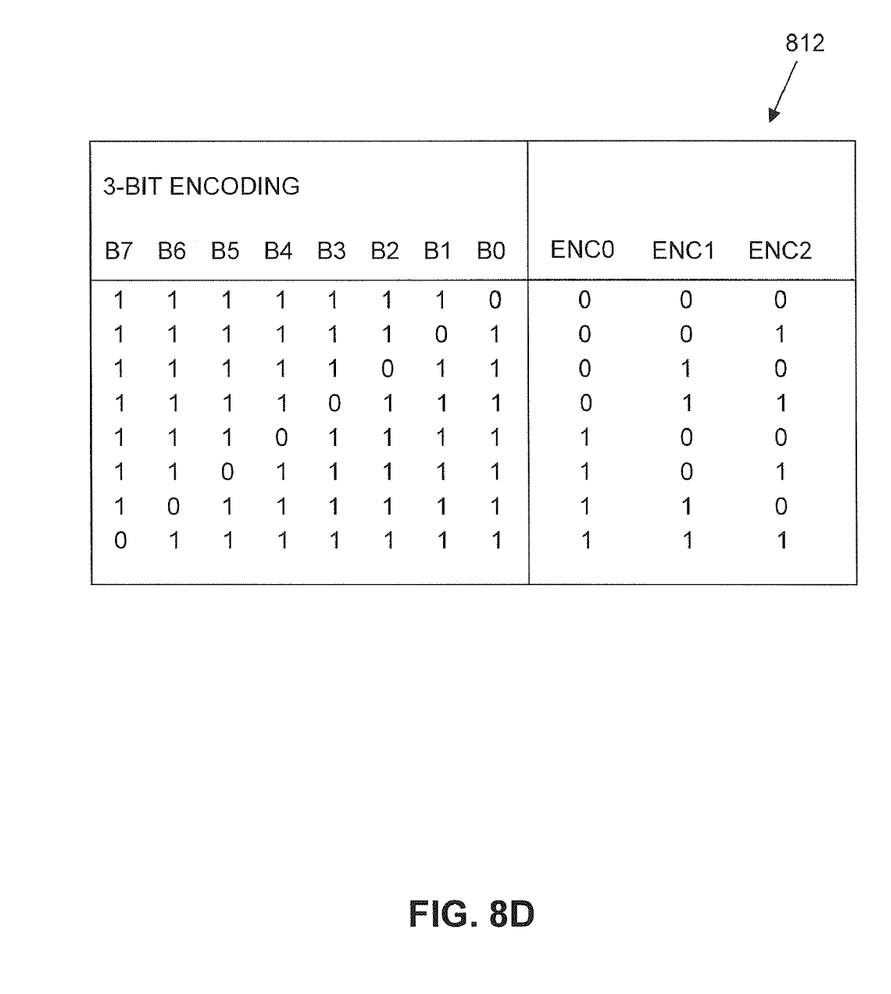
FIG. 8D shows an example decoding logic table implemented by the example decoder circuitry of FIGS. 8A-C.

FIGS. 8A-C illustrate another example decoder circuitry according to an embodiment of the present invention. In particular, FIGS. 8A-C illustrate example decoder circuitry for implementing a 3-bit encoded ROM decoder according to an embodiment of the present invention. The example decoder circuitry of FIGS. 8A-C implement a 3-bit encoded ROM decoder for reading a 3-bit encoded ROM memory cell, programmable according to the decoding logic table of FIG. 8D. As shown in FIGS. 8A-C, the example decoder circuitry include three substantially similar decoding circuits, with the decoding circuit shown in FIG. 8A configured to resolve the value of the first bit of the three bits encoded in the 3-bit encoded ROM memory cell (shown as ENC0 806 in FIG. 8A), the decoding circuit shown in FIG. 8B configured to resolve the value of the second bit of the three bits encoded in the 3-bit encoded ROM memory cell (shown as ENC1 808 in FIG. 8B), and the decoding circuit shown in FIG. 8C configured to resolve the value of the third bit of the three bits encoded in the 3-bit encoded ROM memory cell (shown as ENC2 810 in FIG. 8C). The three decoding circuits as can be seen from FIGS. 8A-C only differ with respect to the manner in which the bit lines (B0-B3) from the encoded ROM memory are connected to the input terminals of the decoding circuit. Thus, for the purpose of simplification, only decoding circuit 800 of FIG. 8A will be described herein, with the description/operation of the decoding circuits of FIGS. 8B and 8C becoming readily apparent to a person of skill in the art in view of the teachings herein.

Decoding circuit 800 is similar to decoder circuit 600 described above with respect to FIG. 6A, with the only difference being that decoder circuit 800 includes four additional input transistors for receiving the four additional bit lines (B4-B7) from a 3-bit encoded ROM memory. Thus, as shown in FIG. 8A, the input circuitry of decoder 800 includes four series-coupled transistors 804-{0, ..., 3} or 804-{4, 7} per branch.

Input transistors 804-{0, . . . 7} respectively receive input signals 802-{0, . . . , 7}. Input transistors 802 may be NMOS transistors as shown in FIG. 8A. Alternatively, PMOS or other transistor types may be used as would be understood by a person skilled in the art based on the teachings herein. Input signals 802-{0, . . . , 7} correspond respectively to bit lines B0-B7 from a 3-bit encoded ROM memory. For example, input signals 802-{0, . . . , 7} may correspond respectively to bit lines 510_1 to 510_7, used to read out the data stored in the memory cell of MOS transistor 502 in FIG. 5. Input signals 802-{0, . . . , 7} can take values according to the eight possible logic combinations of bit lines B0-B7 shown in FIG. 8D.

Operation of decoding circuit 800 to generate signal ENC0 806 based on input signals 802-{0, . . . , 7} is substantially similar to the operation of decoder circuit 600 described above and thus will be omitted herein.

As would be understood by a person skilled in the art based on the teachings herein, the decoding circuits of FIGS. 8A-8C may also be implemented using a multi-leg per input branch configuration as described with respect to FIG. 7.

Embodiments provide several improvements over prior solutions which rely primarily on CMOS logic (e.g., inverters). For example, embodiments provide faster decoding by limiting the number of decoding stages to a single stage. Further, embodiments allow the use of partial swing (as opposed to full swing) on the bit lines, which results in significant power reduction. This, in turn, results in reduced amounts of capacitor discharges when reading the data.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A decoder circuit, comprising:
   input circuitry having a plurality of input branches, each of said input branches including a plurality of series-coupled transistors; and
   output circuitry, including a cross-coupled transistor structure, coupled to said input circuitry;
   wherein each of said plurality of series-coupled transistors receives a respective one of a plurality of bit lines of a memory cell; and wherein said output circuitry produces a decoded bit value based on the plurality of bit lines.

2. The decoder circuit of claim 1, wherein said memory cell is a 2-bit encoded memory cell, wherein each of said input branches includes two series-coupled transistors.

3. The decoder circuit of claim 2, wherein the decoded bit value represents a value of a first bit or a second bit encoded in said encoded memory cell.

4. The decoder circuit of claim 1, wherein said memory cell is a 3-bit encoded memory cell, wherein each of said input branches includes three series-coupled transistors.

5. The decoder circuit of claim 4, wherein the decoded bit value represents a value of a first, second, or third bit encoded in said encoded memory cell.

6. The decoder circuit of claim 1, wherein said cross-coupled transistor structure includes first and second branches, each comprising a plurality of series-coupled transistors.

7. The decoder circuit of claim 6, wherein a common gate terminal of the first branch is coupled to a common drain terminal of the second branch, and wherein a common gate terminal of the second branch is coupled to a common drain terminal of the first branch.

8. The decoder circuit of claim 6, wherein each of said first and second branches of the cross-coupled transistor structure includes series-coupled NMOS and PMOS transistors.

9. The decoder circuit of claim 6, wherein each of said first and second branches of the cross-coupled transistor structure is series-coupled to a respective one of the plurality of input branches of the input circuitry.

10. The decoder circuit of claim 6, wherein the output circuitry further comprising an inverter circuit, coupled to an appropriate one of the first and second branches of the cross-coupled transistor structure to generate said decoded bit value.

11. The decoder circuit of claim 1, wherein each of said plurality of input branches comprises first and second parallel circuit legs, formed by said plurality of series-coupled transistors.

12. The decoder circuit of claim 11, wherein each of said first and second parallel circuit legs comprises a respective set of said plurality of series-coupled transistors.

13. The decoder circuit of claim 12, wherein said memory cell is a 2-bit encoded memory cell, wherein each of said first and second parallel circuit legs includes two series-coupled transistors.

14. The decoder circuit of claim 12, wherein said memory cell is a 3-bit encoded memory cell, wherein each of said first and second parallel circuit legs includes three series-coupled transistors.

15. The decoder circuit of claim 11, wherein said first and second parallel circuit legs receive identical bit lines of said plurality of bit lines of the memory cell.

16. The decoder circuit of claim 1, further comprising a common pull-down transistor coupled to an end of each of said input branches.

17. The decoder circuit of claim 1, wherein said plurality of series-coupled transistors include NMOS transistors.

18. The decoder circuit of claim 1, wherein said plurality of series-coupled transistors include PMOS transistors.

* * * * *